US007136311B2

(12) United States Patent
Fujikawa

(10) Patent No.: US 7,136,311 B2
(45) Date of Patent: Nov. 14, 2006

(54) LEVEL SHIFTER, LEVEL SHIFT CIRCUIT, ELECTRO-OPTICAL DEVICE, AND ELECTRONIC APPARATUS

(75) Inventor: Shinsuke Fujikawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 81 days.

(21) Appl. No.: 11/079,555

(22) Filed: Mar. 15, 2005

(65) Prior Publication Data

US 2005/0219192 A1 Oct. 6, 2005

(30) Foreign Application Priority Data

Apr. 1, 2004 (JP) ............................ 2004-109223

(51) Int. Cl.
*G11C 7/00* (2006.01)

(52) U.S. Cl. ............................ 365/189.11; 365/189.02; 365/189.05; 365/189.12

(58) Field of Classification Search ........... 365/189.11, 365/189.02, 189.05, 189.12
See application file for complete search history.

(56) References Cited

U.S. PATENT DOCUMENTS 6,233,188 B1 * 5/2001 Kai ............................ 365/203
6,498,761 B1 * 12/2002 Banba et al. ............... 365/226
2003/0001616 A1 1/2003 Fujikawa et al.
2004/0125102 A1 7/2004 Sato et al.

FOREIGN PATENT DOCUMENTS

| | | |
|---|---|---|
| JP | A 11-220380 | 8/1999 |
| JP | A 2003-110419 | 4/2003 |
| JP | A 2003-110420 | 4/2003 |
| JP | A 2004-205957 | 7/2004 |

* cited by examiner

*Primary Examiner*—Van Thu Nguyen
*Assistant Examiner*—Pho M. Luu
(74) *Attorney, Agent, or Firm*—Oliff & Berridge, PLC

(57) ABSTRACT

To provide a level shift circuit which has reduced power consumption. A level shift circuit includes level shifters and a control unit. The control unit generates control signals for controlling operation states of the level shifters, respectively. The control unit has an R memory Mr1, a G memory Mg1, and a B memory Mb1. The G memory Mg1 has a stored content which is set to an operation permission state by means of a low-amplitude selection signal RSEL and which is reset to an operation inhibition state by means of a low-amplitude selection signal BSEL. During a period from the time when the low-amplitude selection signal BSEL becomes active up to the time when the low-amplitude selection signal RSEL becomes active, the operation of the level shifter stops. As a result, power consumption decreases.

11 Claims, 12 Drawing Sheets

LEVEL SHIFTER, LEVEL SHIFT CIRCUIT, ELECTRO-OPTICAL DEVICE, AND ELECTRONIC APPARATUS

BACKGROUND

The present invention relates to a level shifter, a level shift circuit, an electro-optical device, and to an electronic apparatus which can reduce power consumption.

In recent years, electro-optical devices having an electro-optical element such as a liquid crystal or an organic light-emitting diode have been widely spread, instead of a display device having a cathode ray tube. The electro-optical devices are broadly classified as either a passive matrix type or an active matrix type. The active matrix type electro-optical device has scanning lines each extending in a row direction, data lines each extending in a column direction, and pixel electrodes provided corresponding to intersections of the scanning lines and the data lines. Furthermore, thin film transistors are provided between the data lines and the pixel electrodes at the intersections, which are turned on and off according to scanning signals supplied to the scanning lines. In addition, a counter electrode is provided corresponding to the pixel electrodes, and an electro-optical material is interposed between the pixel electrodes and the counter electrode.

In order to drive the electro-optical material or the thin film transistors, a relatively high voltage is needed. On the other hand, an external control circuit which supplies a clock signal, a control signal, and so on for driving to the electro-optical device typically has CMOS (Complementary Metal Oxide Semiconductor) circuits, and the amplitude of a logical signal is in a range of from 3 to 5 V. Accordingly, the electro-optical device generally converts a low-amplitude logical signal into a high-amplitude logical signal by using an amplitude conversion (hereinafter, simply referred to as a 'level shifter').

As the level shifter, a level shifter in which an input signal is input via an alternating current (AC) coupling is known (for example, see Patent Document 1).

[Patent Document 1] Japanese Unexamined Patent Application Publication No. 2003-110420 (claim 1 and Abstract)

The level shifter converts the signal level, but it is not necessary to operate continuously according to an action of the signal to be converted. For example, in an electro-optical device for color display, there is a case in which a demultiplexer is used to output multiplexed data line signals corresponding to respective colors of R, G, and B from the data line driving circuit via one output terminal and distribute the multiplexed data line signals to data lines for R, G, and B. The demultiplexer outputs the data line signals to the data lines of the respective colors according to color selection signals of R, G, and B which become exclusively active. In this case, it is common practice to convert the signal levels of the color selection signals by means of the level shifter. As such, the level shifter is not needed to continuously operate, and it may operate only during a period in which the input color selection signal becomes active.

On the other hand, in a conventional level shifter, when a power is supplied, some of the transistors are not completely turned off, so that a small current flows between a source and a drain of the transistor. For this reason, there is a problem in that power is consumed during a period in which it is not necessary to operate originally.

Accordingly, the present invention has been made in consideration of the above-mentioned problems, and it is an object of the present invention to provide a level shifter, a level shift circuit, an electro-optical device, and an electronic apparatus having reduced power consumption.

SUMMARY

There is provided a level shift circuit according to the present invention comprising a plurality of level shifters being supplied with a plurality of selection signals which become exclusively and sequentially active, respectively, and converting signal levels of the selection signals to output the converted signals; and a plurality of control circuits, each supplying control signals, which control an operation state of each of the level shifters, to the corresponding level shifter. Each of the control circuits generates the control signal indicating an operation permission state by using an activated preceding selection signal before the selection signal supplied to the corresponding level shifter becomes active and the control signal indicating an operation inhibition state by using an activated succeeding selection signal after the selection signal becomes active, and supplies the control signals to the corresponding level shifter.

The plurality of selection signals become sequentially active, so that the level shifter is not needed to continuously operate and it may operate only during a period in which the input selection signal becomes active. According to the present invention, with a selection signal as a reference, the control circuit permits the operation of the level shifter by using a preceding selection signal to the reference selection signal and inhibits the operation of the level shifter by using a succeeding selection signal to the reference selection signal. Accordingly, the level shifter operates only during a necessary period and does not operate during an unnecessary period. Thus, power consumption can be reduced as compared to the case in which the level shifter continuously operates.

In this case, the preceding selection signal preferably becomes active just before the selection signal supplied to the corresponding level shifter becomes active, and the succeeding selection signal preferably becomes active just after the selection signal supplied to the corresponding level shifter becomes active. As a result, power consumption can be most effectively reduced.

In addition, the control circuit may generate the control signal by using the selection signal supplied to the level shifter, or it may generate the control signal by using the selection signal output from the level shifter. It is necessary for the control circuit to specify the period in which the corresponding level shifter operates, and thus any selection signals before or after the level conversion may be used to specify the timing.

In addition, in the above-described level shift circuit, each of the control circuits preferably has a memory circuit for storing the operation state, and the memory circuit preferably stores the operation permission state when the preceding selection signal becomes active and the operation inhibition state when the succeeding selection signal becomes active and outputs signals according to the stored content as the control signals. In this case, the operation state of the level shifter may be stored in the memory, and thus the level shifter can be controlled.

In this case, the level shift circuit may further comprise initializing means which executes an initialization operation by setting the stored content of a predetermined memory circuit to the operation permission state and by resetting the stored content of other memory circuits to the operation inhibition state, among the memory circuits. Just after power is supplied to the level shift circuit, the stored content of the memory circuit cannot be uniquely determined, and thus the stored contents of all of the memory circuits may indicate the operation inhibition state. In this case, the operations of all of the level shifters are inhibited, and thus the level conversion is not performed even when the selection signal becomes active. According to the present invention, the level shift circuit has the initializing means, and thus the above-described problem can be solved. Furthermore, the initializing means sets only the stored content of the predetermined memory circuit to an operation permission state and operate only the level shifter corresponding to the predetermined memory circuit and stop other level shifters. The selection signals becomes sequentially active, so that the predetermined memory circuit may be set to operate the level shifter which is supplied with the selection signal active for the first time after power is supplied. Accordingly, power consumption can be reduced and an erroneous operation can be prevented from being caused when power is supplied.

Next, there is provided a level shifter according to the present invention which converts a signal level of an input signal and outputs the converted signal as an output signal. The level shifter comprises a first capacitive element one end of which is supplied with the input signal; a second capacitive element one end of which is connected to the one end of the first capacitive element; a first transistor whose gate is connected to the other end of the first capacitive element and whose source is connected to a high-potential supply line; a second transistor whose gate is connected to the other end of the second capacitive element, whose source is connected to a low-potential supply line, and whose drain is connected to a drain of the first transistor; a first clocked inverter to which power is supplied from the high-potential supply line and the low-potential supply line, the power supply being controlled based on a control signal, and an input terminal and an output terminal of which are connected to the gate of the first transistor; a second clocked inverter to which power is supplied from the high-potential supply line and the low-potential supply line, the power supply being controlled based on a control signal, and an input terminal and an output terminal of which are connected to the gate of the second transistor; and an inverter an input terminal of which is connected to the drains of the first transistor and the second transistor and which outputs the output signal via an output terminal.

According to this level shifter, the first clocked inverter serves as a means for supplying an offset voltage (a bias voltage) to the gate of the first transistor, and the second clocked inverter serves as a means for supplying an offset voltage (a bias voltage) to the gate of the second transistor. Further, as for the first and second clocked inverters, the power supply is controlled based on the control signal. Accordingly, the power supply can be controlled by means of the control signal which is supplied from an exterior. When the power supply is interrupted, the first and second clocked inverters stop to operate, so that the offset voltage is not supplied. Thus, the first and second transistors stop to operate, and also the inverter stops to operate. As a result, a breakthrough current does not flow through the level shifter. According to the level shifter, the operation state may be externally controlled, so that it may operate during the necessary period, thereby reducing power consumption. Moreover, in the above-described level shift circuit, it is preferable to use the level shifter.

Next, there is an electro-optical device according to the present invention, the electro-optical device comprising: the above-described level shift circuit; a plurality of scanning lines; a plurality of data lines; a plurality of electro-optical elements provided corresponding to intersections of the scanning lines and the data lines; a scanning line driving circuit for supplying scanning signals to the plurality of scanning lines, respectively; a data line driving circuit for generating a data signal which is supplied to the plurality of data lines; and a plurality of demultiplexing circuits provided for every predetermined number of data lines. Each of the demultiplexing circuits outputs the data signal to one data line selected among the predetermined number of data lines based on a plurality of selection signals output from the level shift circuit.

According to the present invention, the signal level of the selection signal is converted by means of the level shift circuit, and the converted selection signal is output to the demultiplexer. The level shifter constituting the level shift circuit can reduce the breakthrough current of the level shifter during the period in which each of the plurality of selection signals becomes inactive, so that power consumption of the electro-optical device can be reduced. In particular, when the data line driving circuit is provided outside the electro-optical panel (for example, a liquid crystal panel), at one end of the electro-optical panel, it is necessary to form input terminals to which an output signal of the data line driving circuit is input. The number of the required input terminals increases as the number of the data lines increases. On the other hand, in order to prevent an electrical short between the input terminals, it is preferable to reduce the number of the input terminals. To this end, it is necessary to increase the number of the selection signals by increasing the magnification of the demultiplexer. According to the present invention, the level shift circuit which can reduce power consumption is adopted, and thus power consumption of the electro-optical device can be drastically reduced when the magnification of the demultiplexer increases.

Further, there is provided an electro-optical device according to the present invention, the electro-optical device comprising: the above-described level shift circuit having the initializing means; a plurality of scanning lines; a plurality of data lines; a plurality of electro-optical elements provided corresponding to intersections of the scanning lines and the data lines; a scanning line driving circuit for supplying scanning signals to the plurality of scanning lines, respectively; a data line driving circuit for generating a data signal which is supplied to the plurality of data lines; a plurality of demultiplexing circuits provided for every predetermined number of data lines; and timing generating means of generating the plurality of selection signals which are supplied to the level shift circuit. Each of the demultiplexing circuits may output the data signal to one data line selected among the predetermined number of data lines based on the plurality of selection signals output from the level shift circuit, the timing generating means may generate an initialization signal and supplies it to the initializing means prior to the generation of the plurality of the selection signals after power is supplied, and the initializing means may execute the initialization operation based on the initialization signal.

According to the present invention, the timing generating means generates the initialization signal prior to the generation of the plurality of selection signals after power is supplied, so that the selection signals can be normally generated just after power is supplied. As a result, disturbance on an image can be removed when power is supplied.

Further, the timing generating means may generate a first start signal which becomes active at a beginning of a vertical scanning period and supply it to the scanning line driving circuit, may generate a second start signal which becomes active at a beginning of a horizontal scanning period and supply it to the data line driving circuit, and may supply the first start signal or the second start signal to the initializing means, instead of generating the initialization signal and supplying it to the initializing means. In addition, the initializing means may execute the initialization operation based on the first start signal or the second start signal supplied from the timing generating means. According to the present invention, the timing generating means is needed to generate the initialization signal, and thus the configuration can be simplified.

Next, an electronic apparatus according to the present invention has the above-described electro-optical device. In this case, power consumption of the electronic apparatus can be reduced. Such an electronic apparatus may include, for example, a personal computer, a cellular phone, a PDA (personal digital assistant), and so on.

DETAILED DESCRIPTION OF EMBODIMENTS

<1. First Embodiment>

Figure 1:
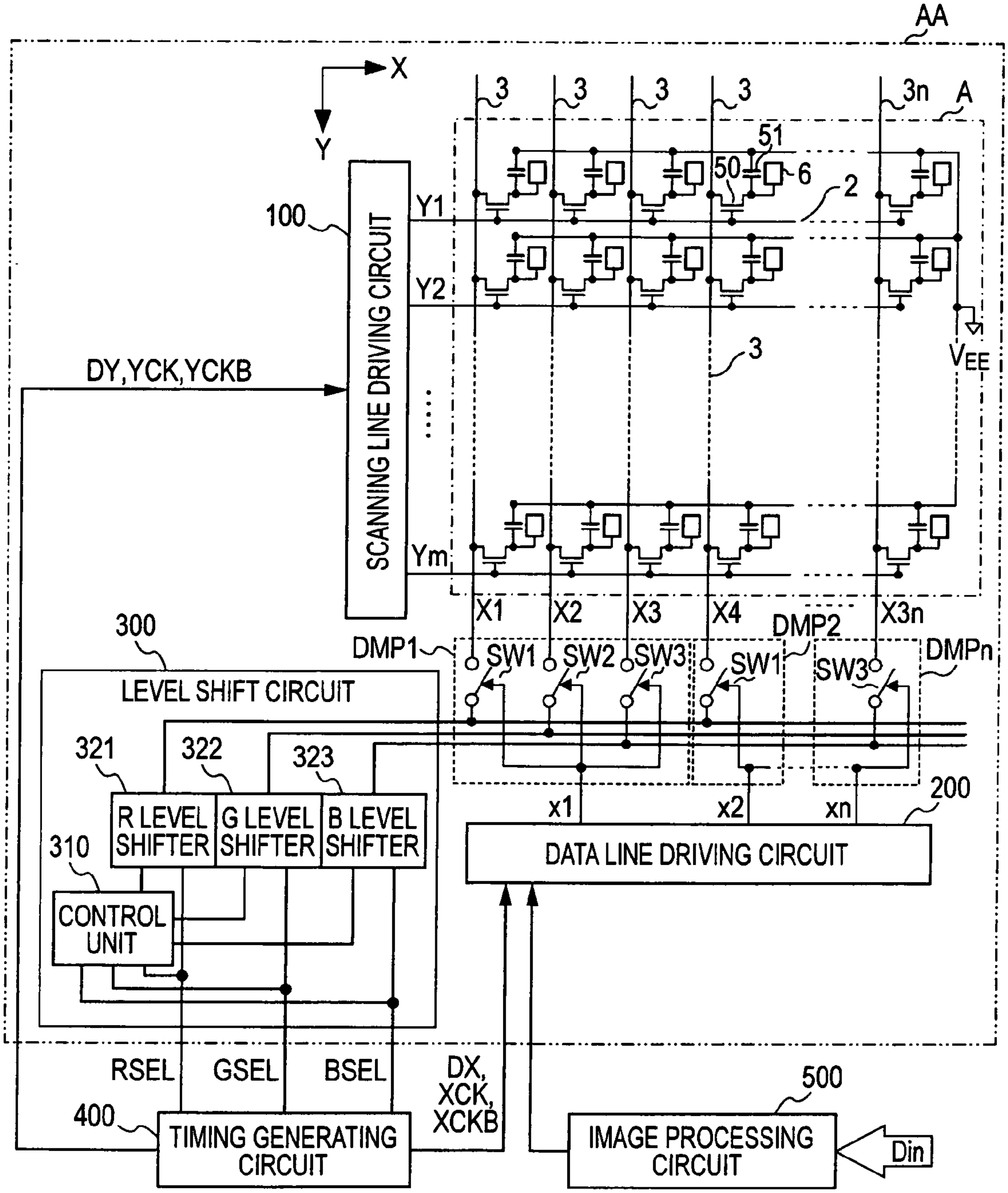
FIG. 1 is a block diagram showing a configuration of an electro-optical device according to a first embodiment of the present invention.

FIG. 1 is a block diagram showing an electrical configuration of an electro-optical device according to a first embodiment of the present invention. The electro-optical device uses a liquid crystal as an electro-optical material, and has a liquid crystal panel AA, a timing generating circuit 400, and an image processing circuit 500. In the liquid crystal panel AA, an element substrate on which thin film transistors (hereinafter, referred to as 'TFTs') are formed and a counter substrate are bonded by a constant interval so that electrode forming surfaces of the respective substrates face each other, and a liquid crystal is interposed therebetween. On the element substrate of the liquid crystal panel AA, an image display region A, a scanning line driving circuit 100, a data line driving circuit 200, a level shift circuit 300, and demultiplexers DMP1 to DMPn are formed.

Input image data Din supplied to the electro-optical device has, for example, a three-bit parallel format. The timing generating circuit 400 generates a Y clock signal YCK, an inverted Y clock signal YCKB, and a Y transmission start pulse DY in synchronization with input image data Din and supplies them to the scanning line driving circuit 100. In addition, the timing generating circuit 400 generates an X clock signal XCK, an inverted X clock signal XCKB, and an X transmission start pulse DX in synchronization with input image data Din and supplies them to the data line driving circuit 200. The Y transmission start pulse DY is a pulse of a vertical scanning period and becomes active only during a predetermined period from the beginning of the vertical scanning period. On the other hand, the X transmission start pulse DX is a pulse of a horizontal scanning period and becomes active only during a predetermined period from the beginning of the horizontal scanning period.

The scanning line driving circuit 100 has shift registers and sequentially transmits the Y transmission start pulse DY in synchronization with the Y clock signal YCK and the inverted Y clock signal YCKB and sequentially generates scanning signals Y1, Y2, . . . , and Ym.

The image processing circuit 500 performs gamma correction or the like on input image data Din to improve light transmission characteristics of the liquid crystal panel AA, generates output image data Dout, and supplies it to the data line driving circuit 200. The data line driving circuit 200 has shift registers, latch circuits, and DA (Digital-to-Analog) conversion circuits. The shift registers sequentially transmit the X transmission start pulse DX in synchronization with the X clock signal XCK and the inverted Y clock signal YCKB and generates latch pulses. The latch circuits latch output image data Dout by using the latch pulses. The DA conversion circuits convert the output signals of the latch circuits by using the DA conversion to generate image signals x1, x2, . . . , xn, respectively. The signals for R, B, and G are multiplexed on each of the image signals x1, x2, . . . , xn in a time-division manner.

Each of the demultiplexers DMP1 to DMPn has three switches SW1, SW2, and SW3, each being composed of the TFT. High-amplitude selection signals RSEL', GSEL', and BSEL' are supplied to the switch SW1, SW2, and SW3, respectively.

The level shift circuit 300 converts the signal levels of low-amplitude selection signals RSEL, GSEL, and BSEL from a low amplitude to a high amplitude to generate the high-amplitude selection signals RSEL', GSEL', and BSEL', respectively. L and H levels of the low-amplitude selection signals RSEL, GSEL, and BSEL are VSSL and VDDL, respectively, and L and H levels of the high-amplitude selection signals RSEL', GSEL', and BSEL' are VSSH and VDDH, respectively. The details of the level shift circuit 300 will be described later.

Next, in the image display region A, m scanning lines 2 (where m is a natural number of 2 or more) are arranged parallel to an X direction and 3n data lines 3 (where n is a natural number of 2 or more) are arranged parallel to a Y direction. In a vicinity of each intersection of the scanning lines 2 and the data lines 3, a gate of a TFT 50 is connected to the scanning line 2, a source of the TFT 50 is connected to the data line 3, and a drain of the TFT 50 is connected to a pixel electrode 6. Then, each pixel is composed of the pixel electrode 6, a counter electrode formed on a counter substrate, and a liquid crystal interposed between these two electrodes. As a result, the pixels are arranged in a matrix shape to correspond to the intersections of the scanning lines 2 and the data lines 3.

In addition, pulsed scanning signals Y1, Y2, . . . , and Ym are line-sequentially applied to the scanning lines 2 to each of which the gate of the TFT 50 is connected. For this reason, if the scanning signal is supplied to the scanning line 2, the TFT 50 connected to the corresponding scanning line 2 is turned on, so that data line signals X1, X2, . . . , and X3*n* supplied from the data lines 3 at the predetermined timing are sequentially written onto the corresponding pixels and stored for a predetermined period.

The orientation and order of liquid crystal molecules change according to a potential level applied to each pixel, so that a gray-scale display resulting from the optical modulation can be realized. For example, while the amount of light passing through the liquid crystal is limited as the applied potential increases in a normally white mode, it is mitigated as the applied potential increases in a normally-black mode. And thus, light having a contrast according to the image signal is emitted for each pixel in the entire liquid crystal display device. For this reason, a predetermined display can be realized.

Next, the details of the level shift circuit 300 will be described. The level shift circuit 300 has an R level shifter 321, a G level shifter 322, a B level shifter 323, and a control unit 310 for controlling the operations of the level shifters 321 to 323, as shown in FIG. 1. The control unit 310 generates control signals C1, C2, and C3 for controlling the operations of the level shifters 321 to 323, respectively.

Figure 2:
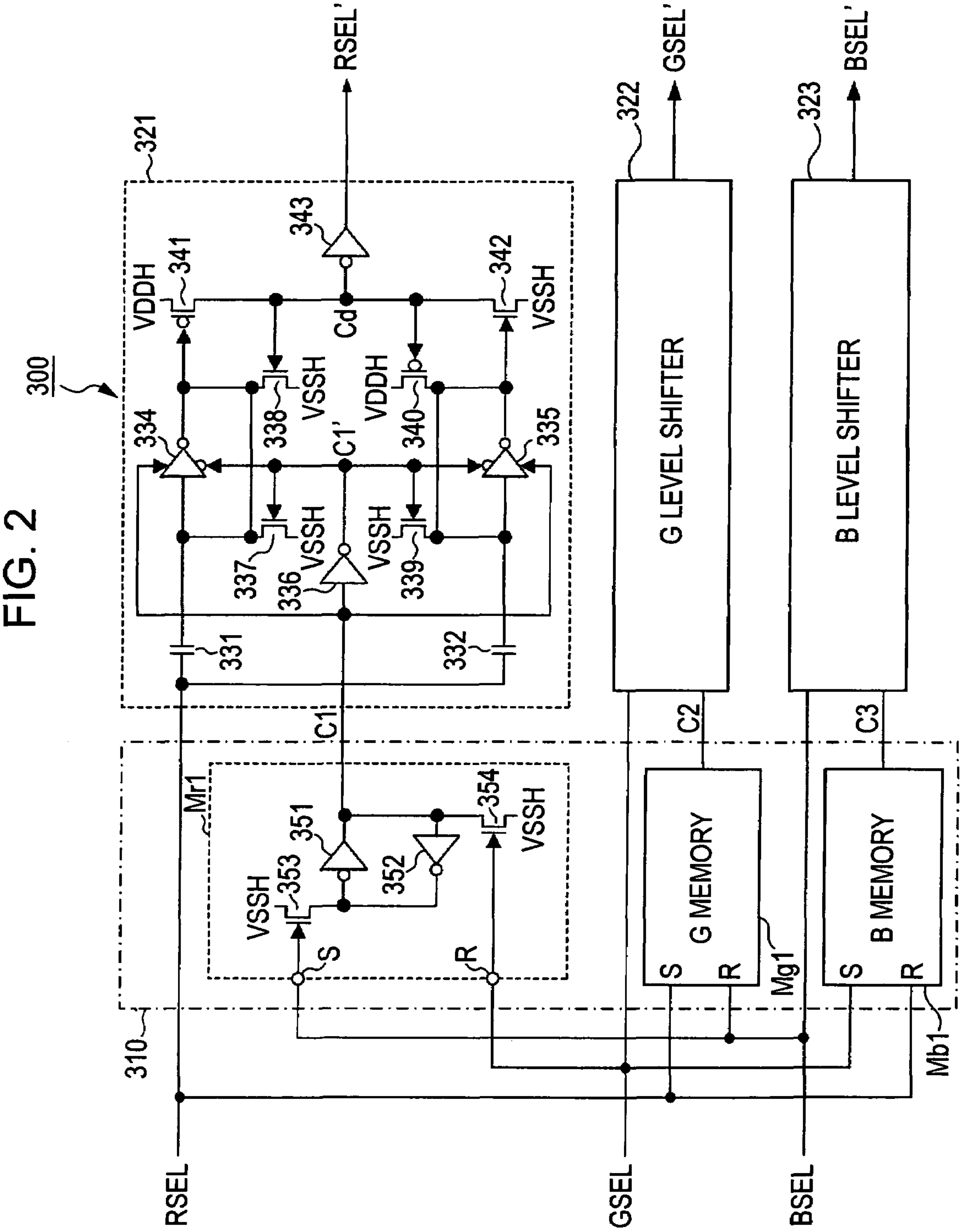
FIG. 2 is a block diagram showing a configuration of a level shift circuit used for the electro-optical device.

FIG. 2 shows a detailed configuration of the level shift circuit 300. The G level shifter 322 and the B level shifter 323 have the same configuration as that of the R level shifter 321. In addition, the control unit 310 has an R memory Mr1, a G memory Mg1, and a B memory Mb1 that correspond to the level shifters 321 to 323, respectively. Each of the G memory Mg and the B memory Mb1 has the same configuration as that of the R memory Mr1 and has a set terminal S and a reset terminal R. These memories serve as control circuits which control the corresponding level shifters.

The low-amplitude selection signal RSEL is supplied to one end of each of capacitors (capacitance) 331 and 332 in the R level shifter 321. On the other hand, the other end of the capacitor 331 is connected to a gate of a P-channel TFT 341, and the other end of the capacitor 332 is connected to a gate of an N-channel TFT 342.

Next, a source of the TFT 341 is connected to a power supply line of the high potential VDDH, a source of the TFT 342 is connected to a power supply line of the low potential VSSH, and drains of the TFTs 341 and 342 are connected to each other in common. In this case, the common drain of the TFTs 341 and 342 is represented by reference numeral Cd. The common drain Cd of the TFTs 341 and 342 is connected to an input terminal of the inverter 343. From an output terminal of the inverter 343, the high-amplitude selection signal RSEL' is output.

A voltage Vofs1 is offset by a clocked inverter 334 constituting a first offset circuit to the other end of the capacitor 331, that is, the gate of the TFT 341. Similarly, a voltage Vofs2 is offset by a clocked inverter 335 constituting a second offset circuit to the other end of the capacitor 332 (a gate Nin). The voltages Vofs1 and Vofs2 are potentials which change according to the output state of the level shifter.

Figure 3:
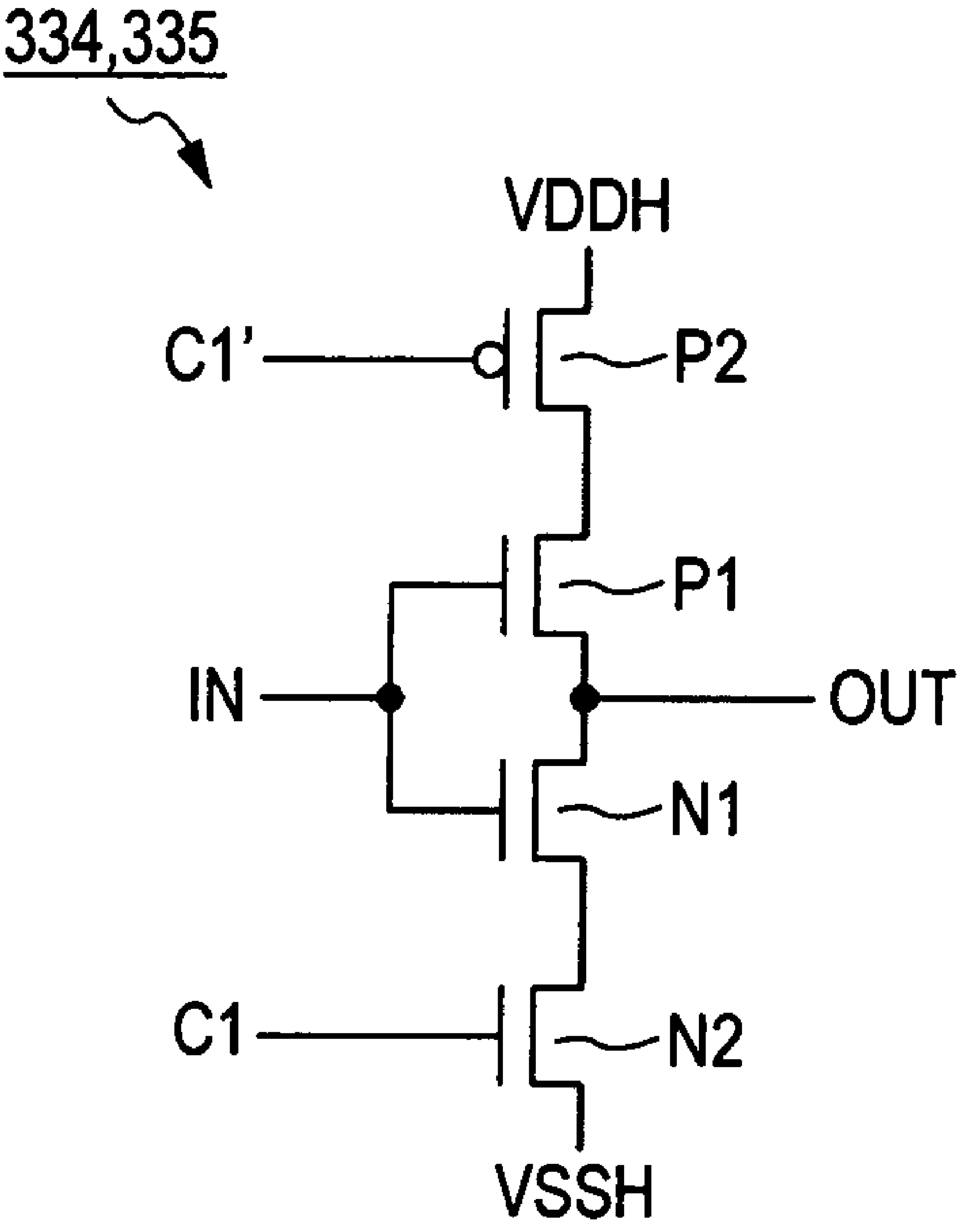
FIG. 3 is a circuit diagram of a clocked inverter used for the level shift circuit.

FIG. 3 shows a circuit diagram of each of the clocked inverters 334 and 335. The control signal C1 is supplied to an N-channel transistor N2, and an inverted control signal C1' is supplied to a P-channel transistor P2. The inverted control signal C1' is a signal which is obtained by inverting the control signal C1 by the inverter 336. Accordingly, when the control signal C1 becomes active, the transistors P2 and N2 are turned on, so that the clocked inverters 334 and 335 operate, allowing the current to flow. Here, when the control signal C1 becomes active, the transistors P2 and N2 become turned on, so that transistors P1 and N1 operate to allow the breakthrough current to flow. Alternatively, when the control signal C1 becomes inactive, the transistors P2 and N2 are turned off, so that the clocked inverters 334 and 335 do not operate, interrupting the breakthrough current to flow into the clocked inverters 334 and 335. Furthermore, when the control signal C1 becomes active, TFTs 337 and 339 shown in FIG. 2 are turned on. For this reason, the potential of VSSH is supplied to the gate terminals of the TFTs 341 and 342. As a result, the common drain Cd has the potential of VDDH, so that the breakthrough current of all TFTs constituting the level shifter 321 does not flow.

As such, the clocked inverters 334 and 335 and the TFTs 337 and 339 have a function of controlling whether or not the level conversion operation performed based on the control signal C1. The R level shifter 321 does not consume power during a period that the level conversion operation is not performed. The clocked inverters 334 and 335 and the TFTs 337 and 339 contribute to a reduction in power consumption of the R level shifter 321 in cooperation with the control unit 310 described later.

When the low-amplitude selection signal RSEL is not inverted for a long time, the signal level having a differential waveform at one end of each of the capacitors 331 and 332 converges to the voltage Vofs1 or Vofs2. As described above, a threshold voltage VthP is set to be lower than the voltage Vofs1. Accordingly, when the low-amplitude selection signal RSEL is not inverted for a long time in a circuit that does not have TFTs 338 and 340, the logical level of the low-amplitude selection signal RSEL may be not subjected to transition, whereas the high-amplitude selection signal RSEL' may be inverted. The TFTs 338 and 340 thus serve to prevent this erroneous operation.

When the low-amplitude selection signal RSEL is subjected to the transition from the low potential VSSL to the high potential VDDL, the gate potential of the TFT 341 exceeds the threshold value VthP due to the rising edge of the differential waveform, so that the TFT 341 is turned off, while the gate potential of the TFT 342 is larger than the threshold value VthN, so that the TFT 342 is turned on. For this reason, the potential of the common drain Cd becomes the low potential VSSH corresponding to the L level. Thus, when the TFT 340 is turned on, the gate potential of the TFT 342 is maintained at the high potential VDDH, regardless of the offset voltage caused by the clocked inverter 335. Then, even when the low-amplitude selection signal RSEL becomes the high potential VDDL covering the long time, the gate potential of the TFT 342 is not less than the threshold value VthN. On the other hand, the TFT 338 is turned off, so that the gate potential of the TFT 341 is one which has offset the voltage Vofs1 to the differential waveform of the low-amplitude selection signal RSEL.

In addition, when the low-amplitude selection signal RSEL is subjected to the transition from the high potential VDDL to the low potential VSSL, the gate potential of the TFT 341 is equal to or less than the threshold value VthP due to the falling edge of the differential waveform, so that the TFT 341 is turned on. Accordingly, the potential of the common drain Cd becomes the high potential VDDH corresponding to the H level. Thus, when the TFT 338 is turned on, the gate potential of the TFT 341 is maintained at the low potential VSSH, regardless of the offset voltage caused by the clocked inverter 334. Then, even when the low-amplitude selection signal RSEL becomes the low potential VSSL covering the long time, the gate potential of the TFT 341 does not exceed the threshold value VthP. On the other hand, the TFT 340 is turned off, so that the gate potential of the TFT 342 is one which has offset the voltage Vofs2 to the differential waveform of the low-amplitude selection signal RSEL. Accordingly, the R level shifter 321 operates stably with no erroneous operation, even when the same logical level covers the long time.

Next, the R memory Mr1 as a part of the control unit 310 will be described. Moreover, the G memory Mg1 and the B memory Mb1 have the same configuration as that of the R memory Mr1. The R memory Mr1 has a latch circuit composed of inverters 351 and 352, and TFTs 353 and 354. A set terminal S is connected to a gate of the TFT 353. When the signal level of the set terminal is the H level, the logical level of the control signal C1 is set to the H level. A gate of the TFT 354 is connected to a reset terminal R. When the signal level of the reset terminal R is the H level, the logical level of the control signal C1 is reset to the L level. That is, the R memory Mr1 serves as an SR flip-flop circuit.

As described above, the low-amplitude selection signals become active cyclically in an order of RSEL, GSEL, BSEL, RSEL, GSEL, BSEL, . . . . As such, when converting the signal level of each signal of a signal group having the cyclically activated signals in such a manner, the level shifter does not need to operate continuously, and it may operate only during a period in which the signal to be converted becomes active. Accordingly, the control unit 310 generates the control signals which permit the operation of the level shifter, to which a corresponding low-amplitude selection signal is supplied, by using a preceding low-amplitude selection signal which precedes the corresponding low-amplitude selection signal and inhibit the operation of the level shifter by using a succeeding low-amplitude selection signal which follows the corresponding low-amplitude selection signal.

Figure 4:
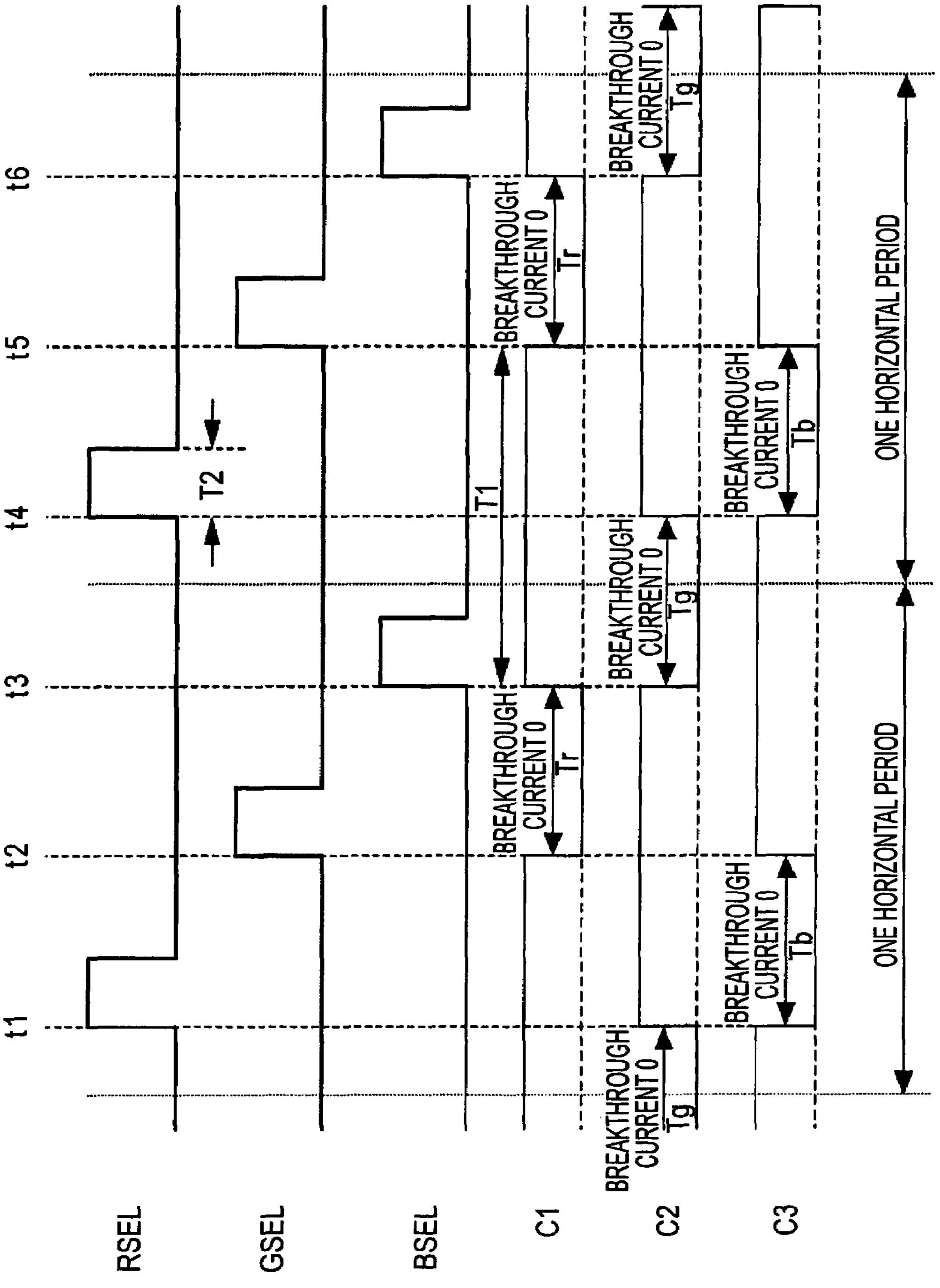
FIG. 4 is a timing chart illustrating an operation of the level shift circuit.

FIG. 4 shows a timing chart of the low-amplitude selection signals and the control signals. The low-amplitude selection signal BSEL is supplied to the set terminal S of the R memory Mr1, while the low-amplitude selection signal GSEL is supplied to the reset terminal R of the R memory Mr1. Accordingly, when the low-amplitude selection signal BSEL becomes active at time t3, the control signal C1 becomes the H level, and then, when the low-amplitude selection signal GSEL becomes active at time t5, the control signal C1 becomes the L level. As a result, the control signal C1 becomes active during a period T1 ranging from the time t3 to the time t5, so that the R level shifter operates. The period Te during which the low-amplitude selection signal RSEL becomes active is included in the period T1, so that the R level shifter 321 may achieve a desired object.

On the other hand, the control signal C1 becomes inactive during a period in which the low-amplitude selection signal BSEL becomes active at time t6 after time t5, so that the R level shifter 231 does not operate. In addition, the R level shifter 231 does not operate during a period Tr ranging from time t2 to time t3. The breakthrough current is '0' during the period Tr, so that power consumption of the R shift register 321 may be reduced by two thirds as compared to a case in which the R level shifter operates continuously. In addition, the G level shifter 322 and the B level shifter 323 do not operate during periods Tg and Tb, respectively, so that power consumption may be reduced by two thirds, similarly to the R shift register 321.

<2. Second Embodiment>

Figure 5:
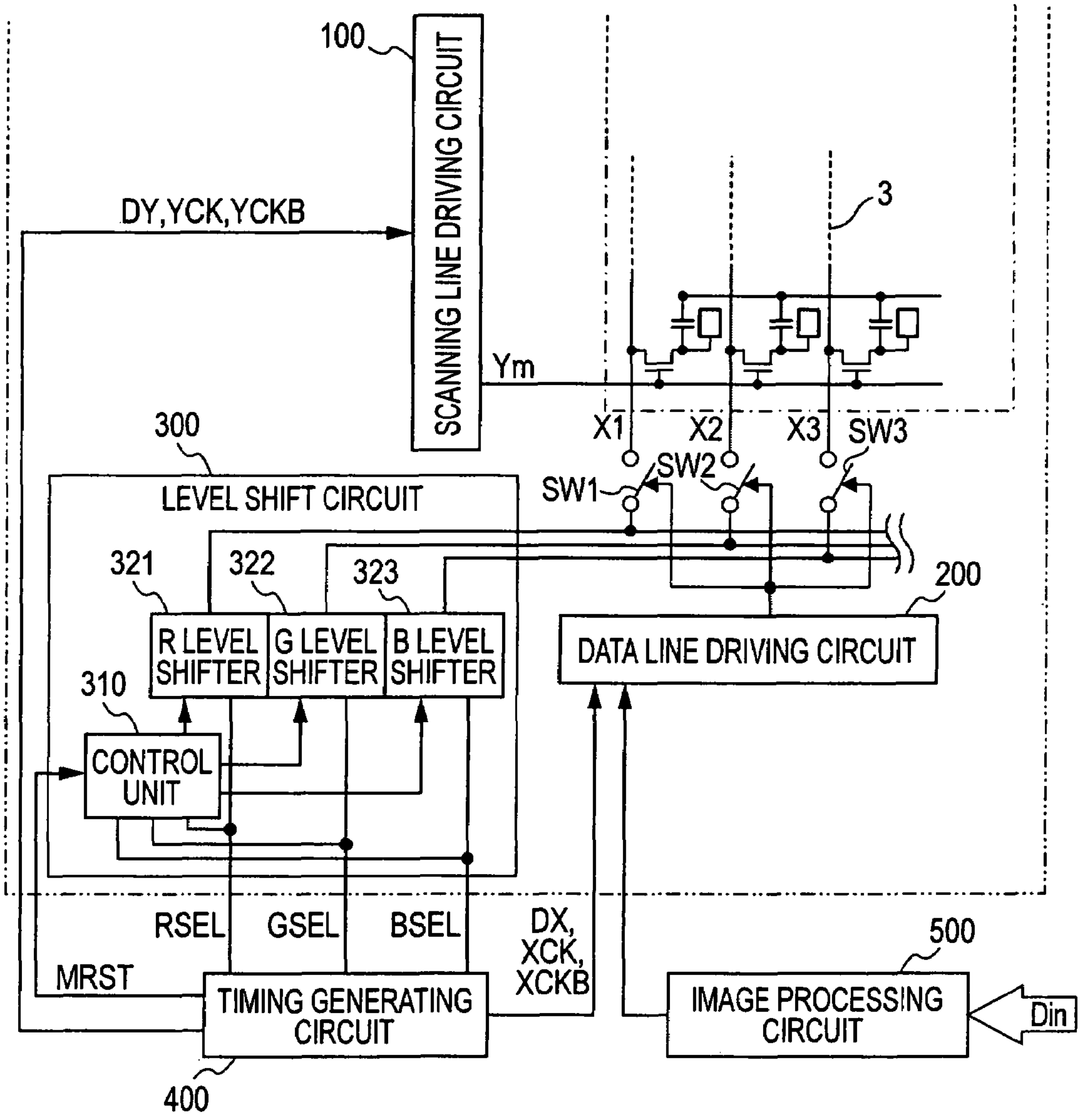
FIG. 5 is a block diagram showing a configuration of an electro-optical device according to a second embodiment of the present invention.

FIG. 5 is a block diagram showing an electrical configuration of essential parts of an electro-optical device according to a second embodiment of the present invention. This electro-optical device has the same configuration as that of the first embodiment except that the control unit 310 of the level shift circuit 300 is reset by a master reset signal MRST. The timing generating circuit 400 generates the master reset signal MRST which becomes active just after power is supplied. In addition, the master reset signal MRST preferably becomes active before the low-amplitude selection signals RSEL, GSEL, and BSEL become active.

Figure 6:
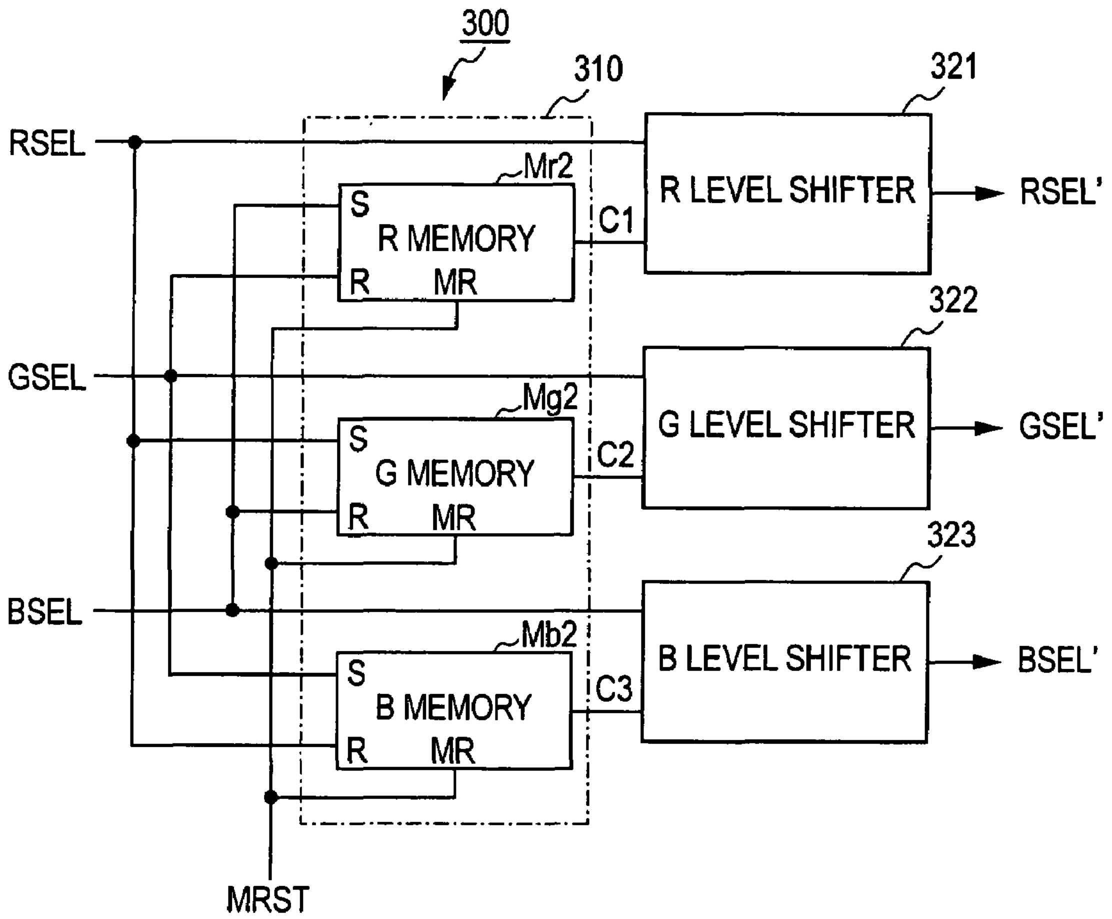
FIG. 6 is a block diagram showing a configuration of a level shift circuit used for the electro-optical device.
Figure 7:
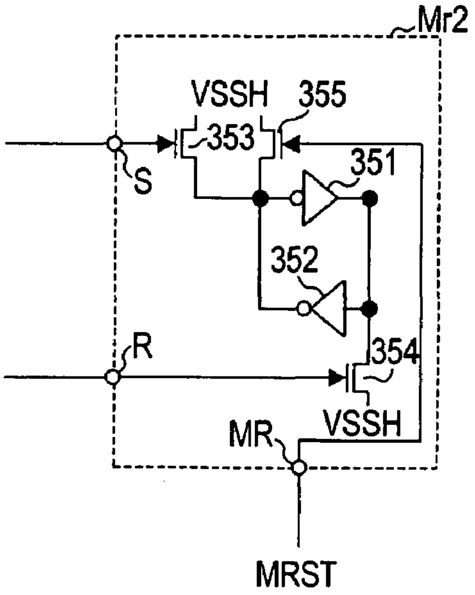
FIG. 7 is a circuit diagram of an R memory used for the level shift circuit.
Figure 8:
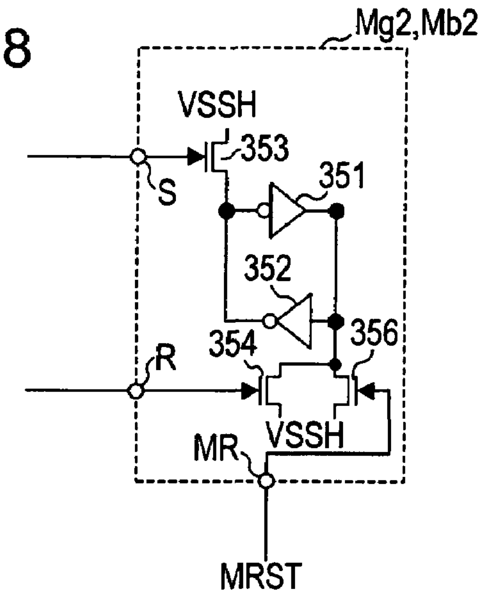
FIG. 8 is a circuit diagram of a G memory and a B memory used for the level shift circuit.

FIG. 6 shows a detailed configuration of the level shift circuit 300. The level shifters 321 to 323 have the same configuration as that of the first embodiment. On the other hand, the R memory Mr2, the G memory Mg2, and the B memory Mb2 differ from the memories Mr1, Mg1, and Mb1 of the first embodiment in that they have the master reset terminal MR. FIG. 7 is a circuit diagram of the R memory Mr2, and FIG. 8 is a circuit diagram of the G memory Mg2 and the B memory Mb2. First, in the R memory Mr2, a TFT 355 is added parallel to the TFT 353. The TFT 355 is turned on when the potential on the master reset terminal MR becomes the H level, thereby making the control signal C1 active. On the other hand, in each of the G memory Mg2 and the B memory Mb2, a TFT 356 is added parallel to the TFT 354. The TFT 356 is turned on when the potential on the master reset terminal MR becomes the H level, thereby making the control signal C1 inactive.

In the above-described control unit 310 of the first embodiment, an initial state of each memory Mr1, Mg1, and Mb1 is indefinite. Specifically, the control signals C1 to C3 are not limited to be generated to permit the operations of the level shifters 321 to 323, respectively. For this reason, there is a case in which all of the control signals C1 to C3 become inactive when power is supplied. In this case, the level conversion is not performed even though the low-amplitude selection signals RSEL, GSEL, and BSEL become active. When one horizontal scanning period passed, however, the levels of the set terminals S of the memories Mr1, Mg1, and Mb1 become sequentially the H level, so that the level shifters return to normal operations.

According to the present embodiment, the master reset signal MRST is supplied to the control unit 310. Then, the stored content in the R memory Mr2 is set to the operation permission state, and the stored contents in the G memory Mg2 and the B memory Mb2 are reset to the operation inhibition state. In this embodiment, the low-amplitude selection signal which becomes active for the first time after power is supplied is RSEL. Accordingly, just after power is supplied, the level shifters 321 to 323 can be stable operated. As a result, the disturbance of the display image can be prevented from occurring.

Moreover, the Y transmission start pulse DY may be supplied as the master reset signal MRST. As described above, the Y transmission start pulse DY becomes active at the beginning of the vertical scanning period. In addition, the low-amplitude selection signals RSEL, GSEL, and BSEL become active after the active period of the Y transmission start pulse DY ends in each vertical scanning period. Accordingly, stable operation can be realized by using the Y transmission start pulse DY as the master reset signal MRST. In addition, the timing generating circuit 400 does not need to generate the master reset signal MRST separately from the Y transmission start pulse DY, so that the configuration of the timing generating circuit 400 may be simplified. In addition, the X transmission start pulse DX may be used as the master reset signal MRST. The X transmission start pulse DX is the signal which becomes active at the beginning of the horizontal scanning period, and the low-amplitude selection signals RSEL, GSEL, and BSEL become active after the X transmission start pulse DX become inactive in each horizontal scanning period. Accordingly, stable operation can be realized even when the X transmission start pulse DX is used as the master reset signal MRST, so that the configuration of the timing generating circuit 400 can be simplified.

<3. Application>

Figure 9:
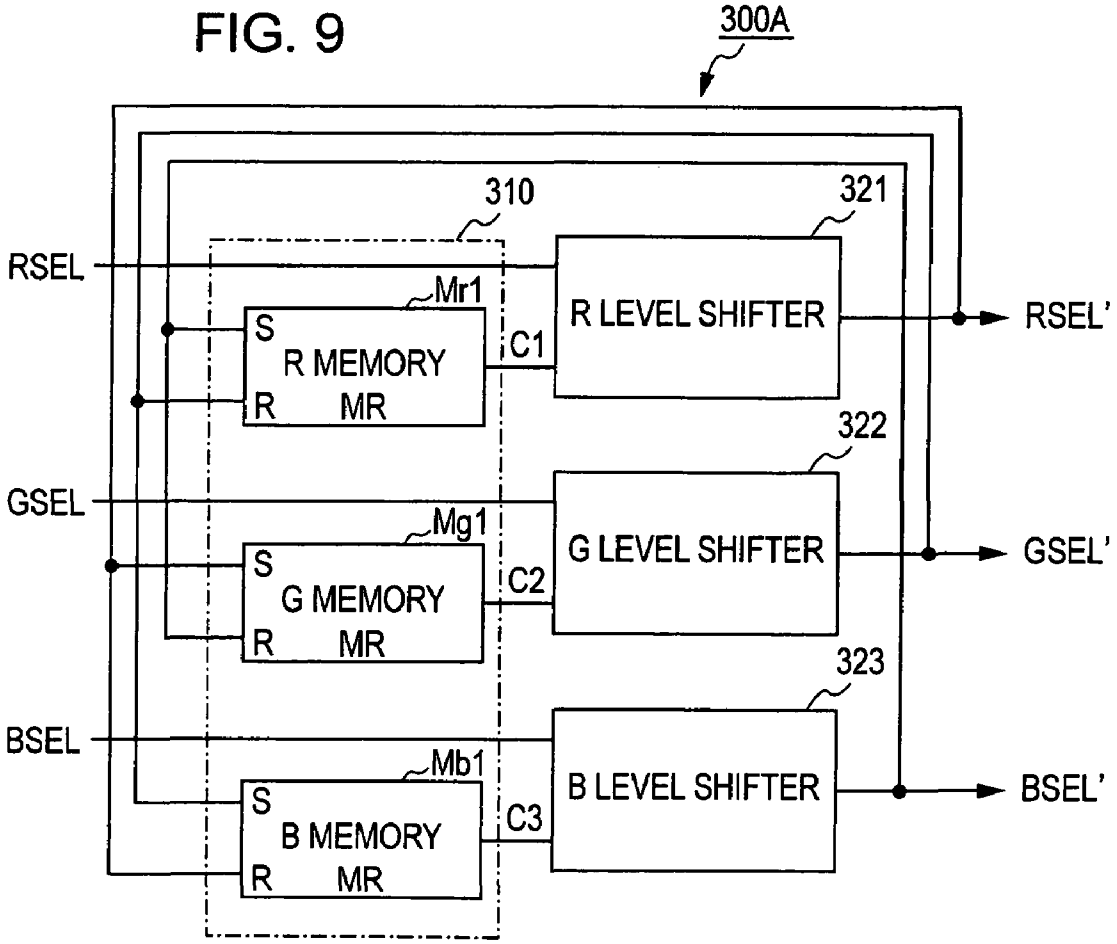
FIG. 9 is a block diagram showing a configuration of a level shift circuit according to an application.
Figure 10:
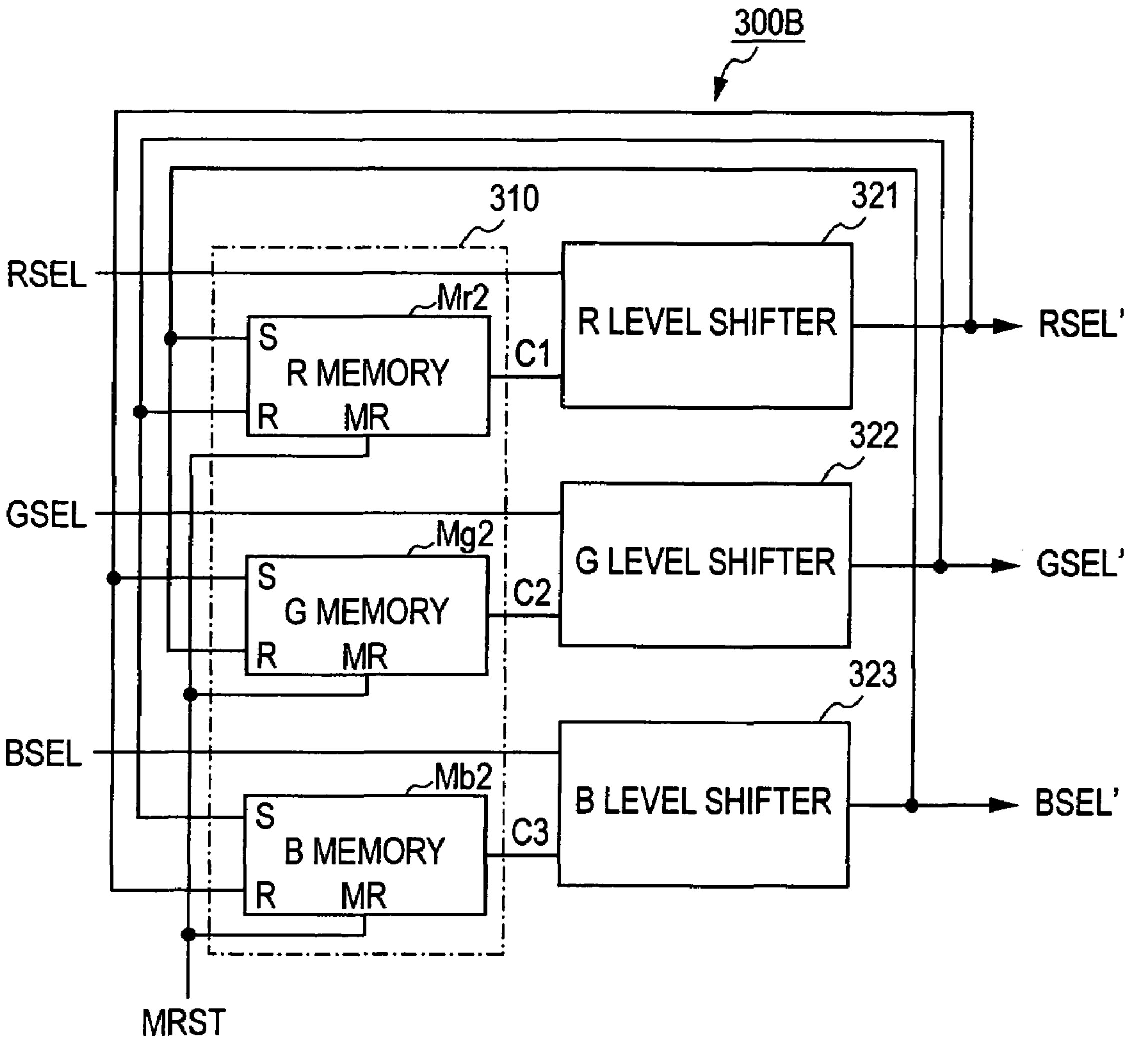
FIG. 10 is a block diagram showing a configuration of a level shift circuit according to another application.

(1) In the above-described first and second embodiments, the control unit 310 generates the control signals C1 to C3 based on the low-amplitude selection signals RSEL, GSEL, and BSEL. However, the control unit 310 may generate the control signals C1 to C3 based on the high-amplitude selection signals RSEL', GSEL', and BSEL'. For example, in the electro-optical device of the first embodiment as shown in FIG. 1, a level shift circuit 300A shown in FIG. 9 may be used instead of the level shift circuit 300. In addition, in the electro-optical device of the second embodiment as shown in FIG. 5, a level shift circuit 300B shown in FIG. 10 may be used instead of the level shift circuit 300.

(2) In the above-described first and second embodiments and the application, a configuration of one input and three outputs is used for the demultiplexers DMP1 to DMPn, however, the magnification may be 3 or more. When the data line driving circuit 200 is provided outside the liquid crystal panel AA, it is necessary to provide input terminals at the end of the liquid crystal panel AA in order to supply the image signals x1, x2, . . . . In such a configuration, it is important to reduce the number of the input terminals in order to prevent the electrical short between the input terminals. In this case, it is effective to increase the magnification of the demultiplexer. However, when the magnification of the demultiplexer increases, the number of the selection signals increases, which results in increasing the number of the level shifters, so that power consumption increases. The above-mentioned level shift circuit can reduce power consumption as the number of the selection signals increases.

Figure 11:
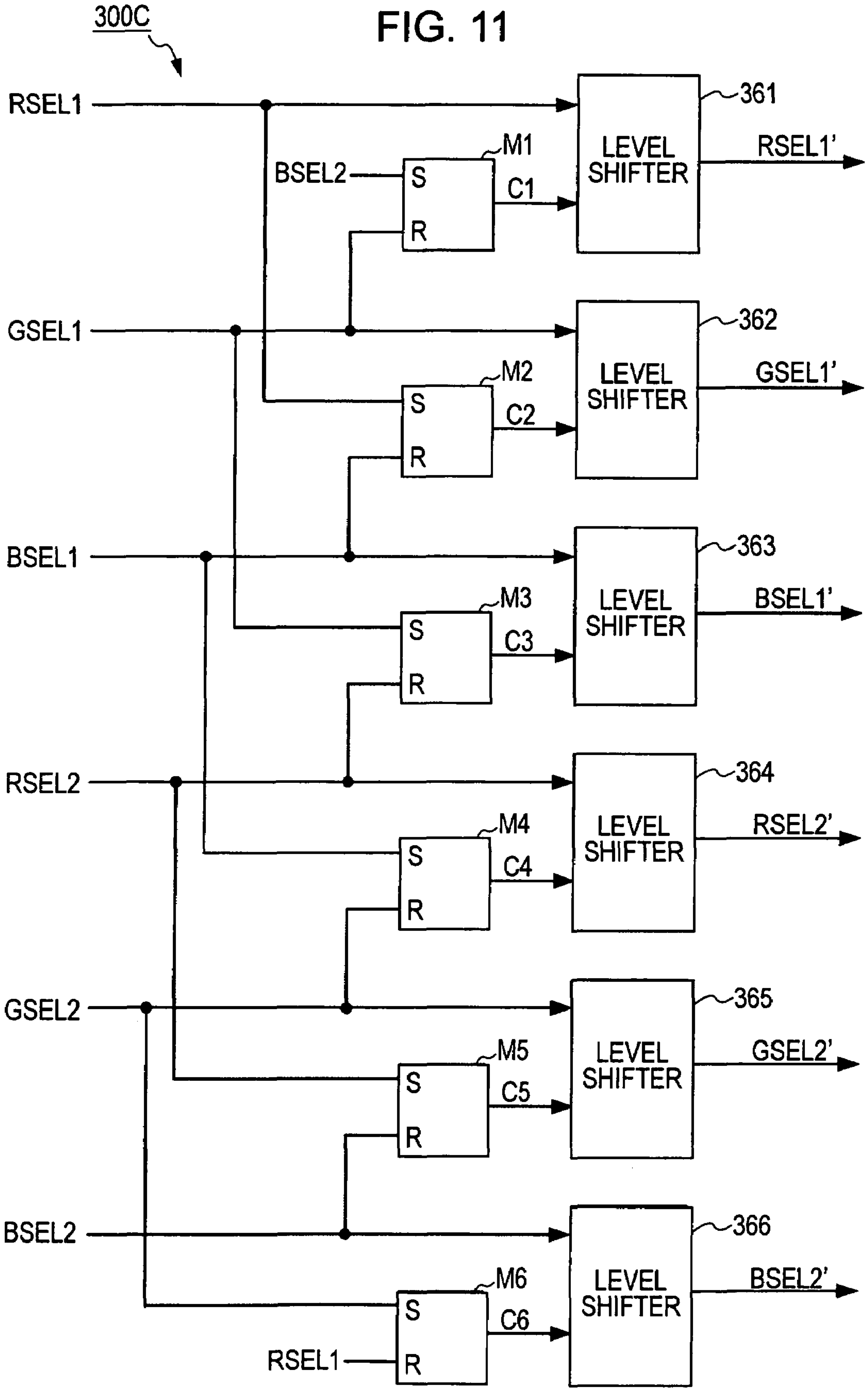
FIG. 11 is a block diagram showing a configuration of a level shift circuit corresponding to a demultiplexer having one input and six outputs.

For example, it is assumed that a demultiplexer having one input and six outputs is used. FIG. 11 is a block diagram showing a level shift circuit 300C corresponding to the demultiplexer having one input and six outputs. Memories M1 to M6 shown in FIG. 11 have the same configuration as that of the R memory Mr1 shown in FIG. 2, and level shifters 361 to 366 have the same configuration as that of the R level shifter 321 shown in FIG. 2.

Figure 12:
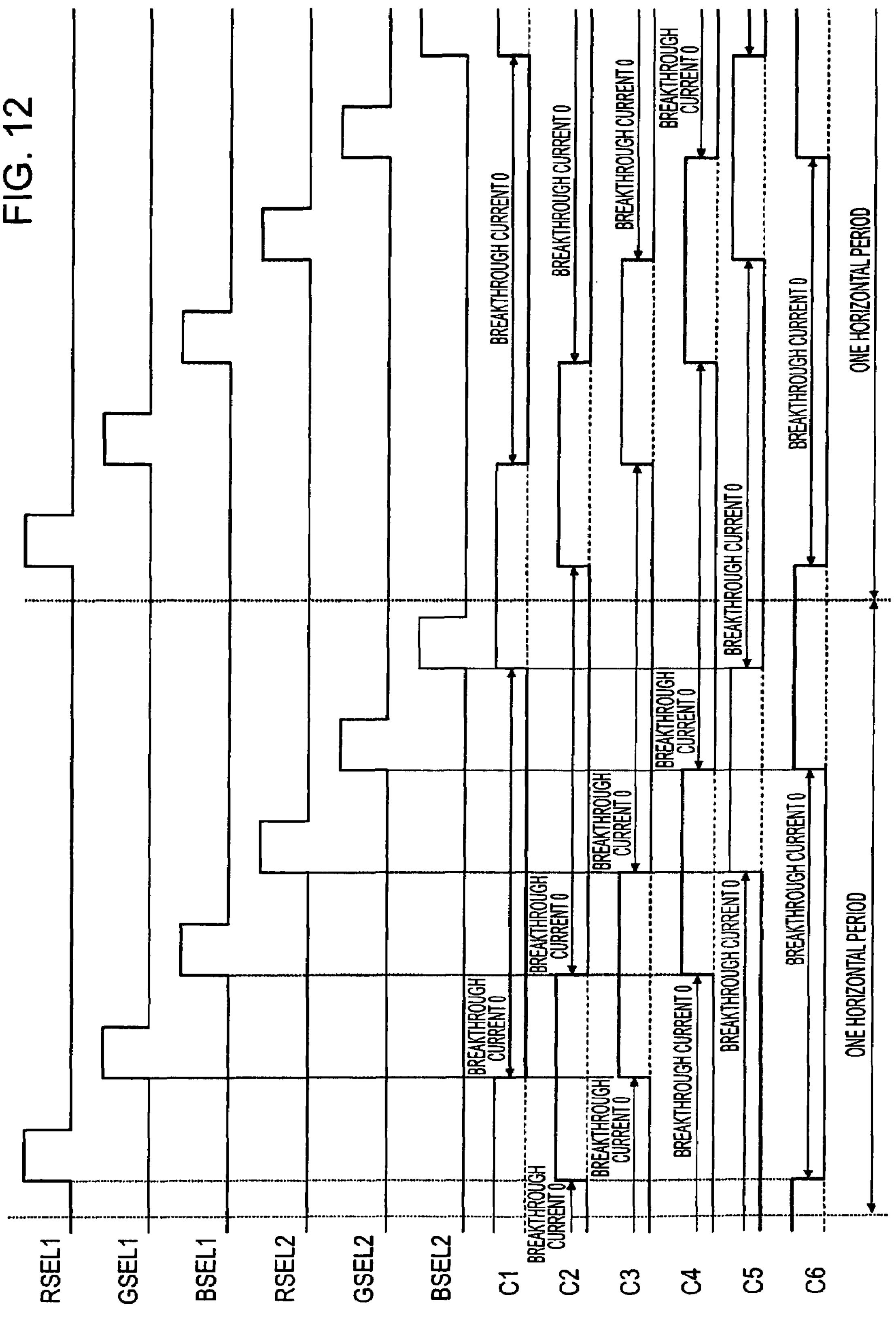
FIG. 12 is a timing chart illustrating an operation of a level shift circuit corresponding to a demultiplexer having one input and six outputs.

FIG. 12 shows a timing chart of the level shift circuit 300C. As shown in FIG. 12, the low-amplitude selection signals become active in an order of RSEL1, GSEL1, BSEL1, RSEL2, GSEL2, and BSEL2, and this cycle is repeated. In this case, in the level shifter 332, the low-amplitude signal RSEL1 is supplied to the set terminal S of the memory M2 corresponding to the level shifter 332 and the low-amplitude selection signal BSEL1 is supplied to the reset terminal R thereof. Accordingly, the control signal C2 becomes active when the low-amplitude selection signal RSEL1 becomes the H level at time t1 and becomes inactive when the low-amplitude selection signal BSEL1 becomes the H level at time t3. Then, the control signal C2 maintains inactive until the low-amplitude selection signal RSEL1 becomes active again at time t2. The operation of the level shifter 332 is interrupted during a period in which the control signal C2 becomes inactive, so that the breakthrough current is '0'. Accordingly, power consumption of the level shifter 332 is reduced by one thirds as compared to a case in which the level shifter operates continuously.

In this example, the low-amplitude selection signal (for example, RSEL1) which becomes active just before a corresponding low-amplitude selection signal (for example, GSEL1) becomes active is used to store the operation permission state in the memory, and the low-amplitude selection signal (for example, BSEL1) which becomes active just after the corresponding low-amplitude selection signal becomes active is used to store the operation inhibition state in the memory, so that the operation of the level shifter to which the corresponding low-amplitude selection signal is supplied according to the stored content in the memory is controlled. Alternatively, instead of the low-amplitude selection signal just before or just after the corresponding low-amplitude selection signal becomes active, the low-amplitude selection signal which precedes or succeeds two low-amplitude selection signals may be used to rewrite the stored content in the memory. In summary, a preceding selection signal which precedes a corresponding low-amplitude selection signal is used to store the operation permission state in the memory, and a succeeding selection signal which succeeds the corresponding low-amplitude selection signal is used to store the operation inhibition state in the memory, so that the operation of the level shifter to which the corresponding low-amplitude selection signal is supplied may be controlled according to the stored content in the memory. Above all things, the effect of reducing power consumption becomes maximized in the case of using the low-amplitude selection signal just before or just after the corresponding low-amplitude selection signal becomes active. When the low-amplitude selection signal which precedes and succeeds two low-amplitude selection signals is used, the above-described effect of reducing power consumption is lowered because the stop period of the breakthrough current is shortened.

In this application, the memories M1 to M6 may have the above-described master reset terminal, and in this case, the Y transmission start pulse DY or the X transmission start pulse DX may also be used as the master reset signal MRST. Furthermore, the high-amplitude selection signals may be supplied to the set terminals S and the reset terminals R of the memories M1 to M6, similarly to the above-described application.

<4. Electronic Apparatus>

Figure 13:
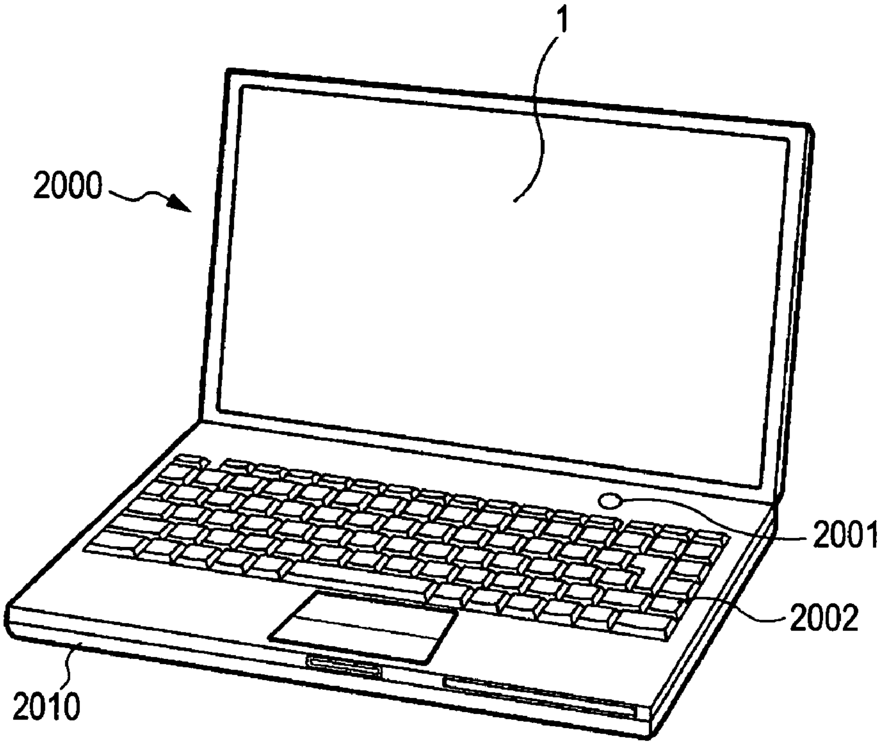
FIG. 13 is a perspective view showing a configuration of a personal computer to which the present invention is applied.

Next, an electronic apparatus to which the electro-optical device according to the present invention is applied will be described. FIG. 13 shows a configuration of a mobile personal computer to which the electro-optical device according to each of the above-described embodiments is applied. The personal computer 2000 has an electro-optical device 1 as a display unit and a main body 2010. A power switch 2001 and a keyboard 2002 are installed in the main body 2010. This electro-optical device operates with reduced power consumption.

Figure 14:
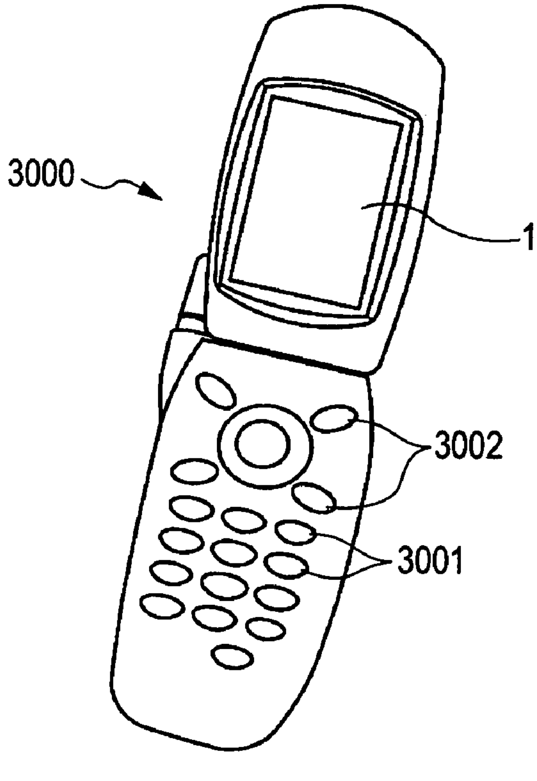
FIG. 14 is a perspective view showing a configuration of a cellular phone to which the present invention is applied.

FIG. 14 shows a configuration of a cellular phone to which the electro-optical device according to each of the above-described embodiments is applied. The cellular phone 3000 has a plurality of operating buttons 3001, scroll buttons 3002, and an electro-optical device as a display unit. By operating the scroll buttons 3002, a screen displayed on the electro-optical device is scrolled. According to the cellular phone 3000, power consumption of the electro-optical device is reduced, so that it may operate for a long time between charging operations.

Figure 15:
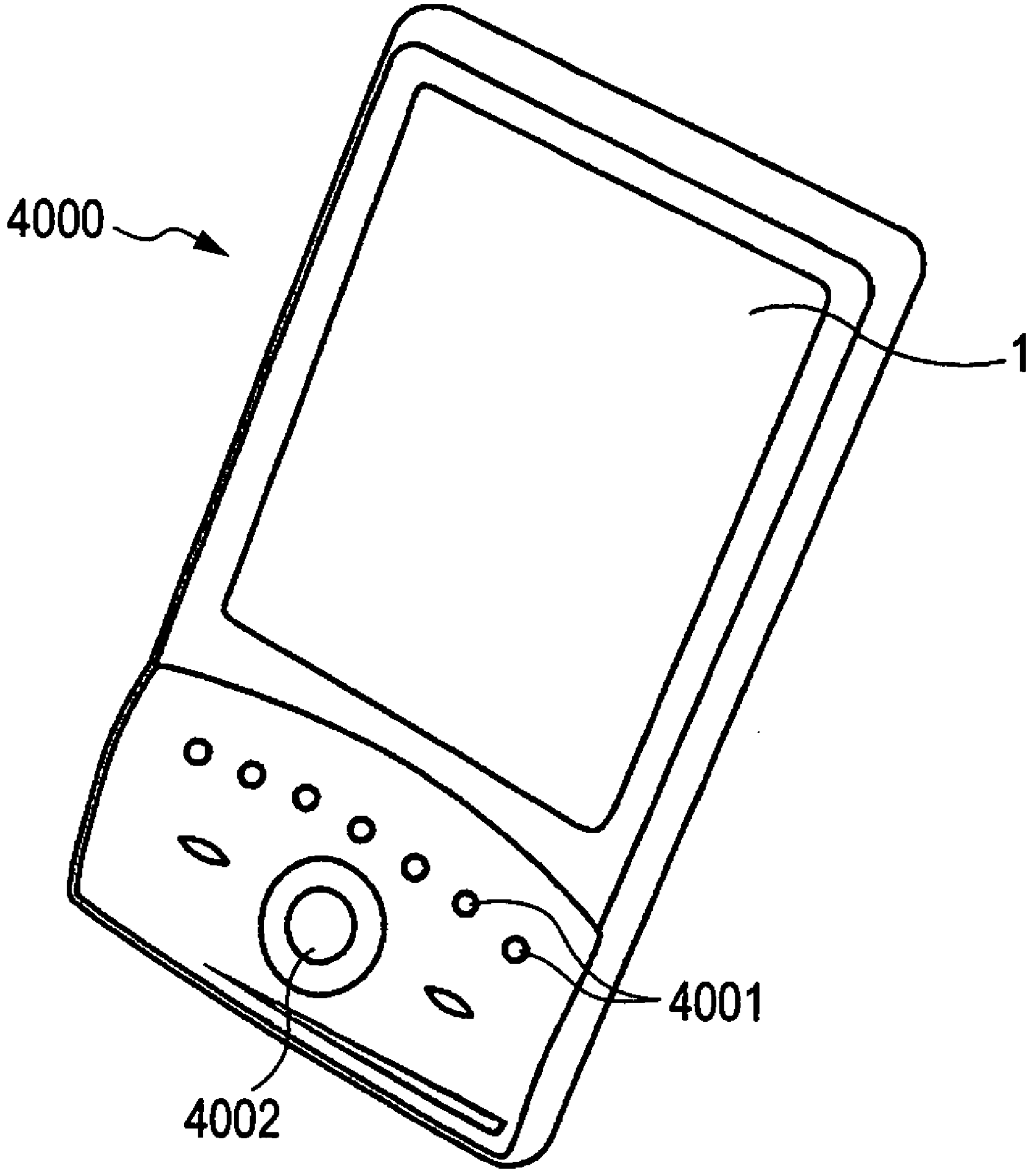
FIG. 15 is a perspective view showing a configuration of a personal digital assistant to which the present invention is applied.

FIG. 15 shows a configuration of a personal digital assistant (PDA) to which the electro-optical device according to each of the above-described embodiments is applied. The PDA 4000 has a plurality of operating buttons 4001, a power switch 4002, and an electro-optical device as a display unit. When the power switch 4002 is operated, a variety of information such as an address list or a schedule list is displayed on the electro-optical device.

Furthermore, instead of the electronic apparatuses shown in FIGS. 13 to 15, an electronic apparatus to which the electro-optical device according to the present invention is applied may include a digital still camera, a liquid crystal television, a viewfinder-type or monitor-direct-view-type video tape recorder, a car navigation device, a pager, an electronic organizer, an electronic calculator, a word processor, a workstation, a videophone, a POS (point of sale) terminal, an apparatus having a touch panel, and so on.

What is claimed is:

1. A level shift circuit comprising:

a plurality of level shifters being supplied with a plurality of selection signals which become exclusively and sequentially active, respectively, and converting signal levels of the selection signals to output the converted signals; and a plurality of control circuits, each supplying control signals, which control an operation state of each of the level shifters, to the corresponding level shifter, wherein each of the control circuits generates the control signal indicating an operation permission state by using an activated preceding selection signal before the selection signal supplied to the corresponding level shifter becomes active and the control signal indicating an operation inhibition state by using an activated succeeding selection signal after the selection signal becomes active, and supplies the control signals to the corresponding level shifter.

2. The level shift circuit according to claim 1, wherein the preceding selection signal becomes active just before the selection signal supplied to the corresponding level shifter becomes active, and the succeeding selection signal becomes active just after the selection signal supplied to the corresponding level shifter becomes active.

3. The level shift circuit according to claim 1, wherein each of the control circuits generates the control signals using the selection signal supplied to the level shifter.

4. The level shift circuit according to claim 1, wherein the control circuit generates the control signals using the selection signal output from the level shifter.

5. The level shift circuit according to claim 1, wherein each of the control circuits has a memory circuit for storing the operation state, and the memory circuit stores the operation permission state when the preceding selection signal becomes active and the operation inhibition state when the succeeding selection signal becomes active and outputs signals according to the stored content as the control signals.

6. The level shift circuit according to claim 5, further comprising:

initializing means which executes an initialization operation by setting the stored content of a predetermined memory circuit to the operation permission state and by resetting the stored content of other memory circuits to the operation inhibition state, among the memory circuits.

7. An electro-optical device comprising:

a level shift circuit as claimed in claim 6;

a plurality of scanning lines;

a plurality of data lines;

a plurality of electro-optical elements provided corresponding to intersections of the scanning lines and the data lines;

a scanning line driving circuit for supplying scanning signals to the plurality of scanning lines, respectively;

a data line driving circuit for generating a data signal which is supplied to the plurality of data lines;

a plurality of demultiplexing circuits provided for every predetermined number of data lines; and timing generating means of generating the plurality of selection signals which are supplied to the level shift circuit, wherein each of the demultiplexing circuits outputs the data signal to one data line selected among the predetermined number of data lines based on the plurality of selection signals output from the level shift circuit, the timing generating means generates an initialization signal and supplies it to the initializing means prior to the generation of the plurality of the selection signals after power is supplied, and the initializing means executes the initialization operation based on the initialization signal.

8. The electro-optical device according to claim 7, wherein the timing generating means generates a first start signal which becomes active at a beginning of a vertical scanning period and supplies it to the scanning line driving circuit, generates a second start signal which becomes active at a beginning of a horizontal scanning period and supplies it to the data line driving circuit, and supplies the first start signal or the second start signal to the initializing means, instead of generating the initialization signal and supplying it to the initializing means, and the initializing means executes the initialization operation based on the first start signal or the second start signal supplied from the timing generating means.

9. An electro-optical device comprising:

a level shift circuit as claimed in claim 1;

a plurality of scanning lines;

a plurality of data lines;

a plurality of electro-optical elements provided corresponding to intersections of the scanning lines and the data lines;

a scanning line driving circuit for supplying scanning signals to the plurality of scanning lines, respectively;

a data line driving circuit for generating a data signal which is supplied to the plurality of data lines; and a plurality of demultiplexing circuits provided for every predetermined number of data lines, wherein each of the demultiplexing circuits outputs the data signal to one data line selected among the predetermined number of data lines based on a plurality of selection signals output from the level shift circuit.

10. An electronic apparatus comprising an electro-optical device as claimed in claim 9.

11. A level shifter which converts a signal level of an input signal and outputs the converted signal as an output signal, the level shifter comprising:

a first capacitive element one end of which is supplied with the input signal;

a second capacitive element one end of which is connected to the one end of the first capacitive element;

a first transistor whose gate is connected to the other end of the first capacitive element and whose source is connected to a high-potential supply line;

a second transistor whose gate is connected to the other end of the second capacitive element, whose source is connected to a low-potential supply line, and whose drain is connected to a drain of the first transistor;

a first clocked inverter to which power is supplied from the high-potential supply line and the low-potential supply line, the power supply being controlled based on a control signal, and an input terminal and an output terminal of which are connected to the gate of the first transistor;

a second clocked inverter to which power is supplied from the high-potential supply line and the low-potential supply line, the power supply being controlled based on a control signal, and an input terminal and an output terminal of which are connected to the gate of the second transistor; and an inverter of which input terminal is connected to the drains of the first transistor and the second transistor and which outputs the output signal via an output terminal.

* * * * *